United States Patent [19]

Nire

[11] Patent Number: 5,311,035
[45] Date of Patent: May 10, 1994

[54] THIN FILM ELECTROLUMINESCENCE ELEMENT

[75] Inventor: Takashi Nire, Kanagawa, Japan

[73] Assignee: Kabushiki Kaisha Komatsu Seisakusho, Tokyo, Japan

[21] Appl. No.: 836,328

[22] PCT Filed: Sep. 4, 1989

[86] PCT No.: PCT/JP89/00909

§ 371 Date: Mar. 2, 1992

§ 102(e) Date: Mar. 2, 1992

[87] PCT Pub. No.: WO91/03918

PCT Pub. Date: Mar. 21, 1991

[51] Int. Cl.$^5$ .............. H01L 33/00; H01J 1/62; H01J 63/04
[52] U.S. Cl. .................. 257/15; 257/102; 257/103; 313/503; 313/509
[58] Field of Search ............ 257/103, 13, 15, 102; 313/500, 503, 506, 509

[56] References Cited

U.S. PATENT DOCUMENTS

| | | | |
|---|---|---|---|
| 4,695,857 | 9/1987 | Baba et al. | 257/15 |
| 4,751,427 | 6/1988 | Barrow et al. | 313/509 |
| 4,877,994 | 10/1989 | Fuyama et al. | 313/506 |
| 5,029,320 | 7/1991 | Kido et al. | 313/509 |
| 5,086,252 | 2/1992 | Kido et al. | 313/509 |

FOREIGN PATENT DOCUMENTS

| | | | |
|---|---|---|---|
| 59-181485 | 10/1984 | Japan | 257/15 |
| 61-144079 | 7/1986 | Japan | 257/15 |
| 61-158691 | 7/1986 | Japan | 257/15 |
| 61-268079 | 11/1986 | Japan | 257/15 |
| 62-224985 | 10/1987 | Japan | 257/15 |

OTHER PUBLICATIONS

Okamoto et al., "Thin Film DC Electroluminescent . . . Structure", IEEE Trans. on Elec. Dev., vol. ED-25, No. 9, Sep. 1978.
Kobayashi et al., "Realization of Both p- and n-Type . . . Superlattices", Appl. Phys. Lett., 51(20), Nov. 1987.
Ramesh et al., "Migration-Enhanced Epitaxy . . . Superlattices", Appl. Phys. Lett. 57(11), Sep. 1990.
Elliott Schlam, "Electroluminescent Phosphors," Proceedings of the IEEE, vol. 61, No. 7, Jul. 1973, pp. 894-901.

Primary Examiner—Rolf Hille
Assistant Examiner—Minhloan Tran
Attorney, Agent, or Firm—Frost & Jacobs

[57] ABSTRACT

A thin film EL element capable of emitting light of different colors desired even at a low applied voltage owing to its high luminescent efficiency and freedom from crystal defects. The thin film EL element is of the dual dielectric structure having a transparent substrate (1), and a transparent conducting film (2), a first dielectric layer (3), a luminescent layer (4), and a second dielectric layer (5), which are formed on top of the other on the substrate, the transparent conducting film and the second dielectric layer being provided with respective electrodes (6a, 6b). It is characterized in that the luminescent layer has a superlattice structure represented by (luminscent host material)/(luminescent host material):(luminescent center impurity). The luminescent layer permits the doping of various luminscent center impurities while keeping its electrical neutrality without a need for the addition of charge compensating elements.

10 Claims, 4 Drawing Sheets

THIN FILM ELECTROLUMINESCENCE ELEMENT

TECHNICAL FIELD OF THE INVENTION

The present invention relates to a thin film electroluminescence (EL) element. More particularly, it is concerned with a thin film EL element having a luminescent layer of superlattice structure which provides improved luminescent efficiency, high luminance, and high reliability.

BACKGROUND OF THE INVENTION

A thin film EL element usually has a structure as shown in FIG. 1. It is made up of a transparent substrate 1, and a transparent conducting film 2, a first dielectric layer 3, a luminescent layer 4, and a second dielectric layer 5, which are formed on top of the other on the substrate. The transparent conducting film and the second dielectric layer 5 are provided with electrodes 6a and 6b, respectively. Upon application of a strong electric field across the terminals 6a and 6b, the luminescent layer 4 emits light which emanates through the transparent substrate 1.

In the foregoing thin film EL element having two dielectric layers, the luminescent layer 4 is made of a luminescent host material doped with an impurity for the luminescent center. A strong electric field applied to the luminescent layer 4 excites the electron energy level of the luminescent center. When the excited state returns to the ground state, the conversion of energy into light takes place. The result is electroluminescence. The light emitted by electroluminescence has a specific wavelength which depends on the luminescent center.

For electroluminescence to take place, it is necessary that a strong electric field be applied to the luminescent layer and the luminescent host material have a broad band gap. A luminescent host material having a narrow band gap does not withstand the strong electric field applied to the luminescent layer 4, but permits an electric current to flow through it. This prevents the application of a strong electric field to the luminescent layer. This is the reason why the conventional luminescent host material was selected from the II-VI compounds, such as ZnS, SrS, CaS, and ZnSe, which have a broad band gap, and the luminescent center was Mn or Eu. Mn-containing ZnS (ZnS:Mn) emits yellowish-orange light and Eu-containing CaS (CaS:Eu) emits red light.

The ZnS:Mn used for the above-mentioned luminescent layer 4 takes on a crystalline structure, with the impurity present as shown in FIG. 2. That is, the Mn atom (of a divalent transition metal) takes the lattice point where the divalent Zn atom of ZnS (II-VI compound) should be. This results in a stable EL element with high luminance.

For the emission of light of different colors, attempts have been made to use a variety of elements as the impurity for the luminescent center. They include, for example, Tb, Tm, Sm, and Ce. When ZnS is doped with Tb, Tm, or Sm, the resulting ZnS:Tb, ZnS:Tm, or ZnS:Sm emits green light, blue light, or reddish-orange light, respectively. When SrS is doped with Ce, the resulting SrS:Ce emits bluish-green light.

The II-VI compound as the luminescent host material is electrically neutral and hence remains stable in its compound form, because the II Group element has a valence of 2 and the VI Group element has a valence of −2. When the luminescent host material is doped with an impurity for the luminescent center, the atoms of the former are partly replaced by the atoms of the latter. In the case where the impurity is a divalent element such as Mn and Eu, the luminescent layer remains electrically neutral and hence stable. This is not true of the case in which the impurity for the luminescent center is a trivalent element such as Tb and Tm. In such a case, the luminescent layer loses the electrical neutrality, giving rise to the vacant lattice point, crystal transition, and crystal strain. Such crystal imperfections prevent the energy applied to the luminescent layer to be effectively transmitted to the impurity for the luminescent center, and hence prevents the light emission with high luminance at a low voltage.

In the case where the luminescent layer 4 is made of ZnS:Tb, the impurity (Tb) exists in the crystal as shown in FIG. 3. Since Tb is trivalent, ZnS:Tb as a whole is not electrically neutral and hence does not glow with sufficient luminance. In order to overcome this disadvantage due to a trivalent impurity, it has been proposed to use Tb together with a charge compensating element such as F, thereby forming $ZnS:Tb,F_x$ ($x=1$ to 3), which glows brightly. The $ZnS:Tb,F_x$ takes on the crystalline structure in which the impurity exists as shown in FIGS. 4 and 5. The existence of F atoms in the crystal makes the luminescent layer unstable and hence poses a problem associated with its reliability (operational life).

A possible alternative is to use a III-V compound, with the trivalent element therein partly replaced by a trivalent impurity for the luminescent center. A disadvantage of this doped compound is that it is necessary to apply a strong electric field (about 1 MV/cm) to excite the luminescent center. Any material to withstand such a strong electric field should have a band gap greater than about 3 eV. However, ordinary III-V compounds (such as InP, GaP, and GaAs) lack such a great band gap and hence are unsuitable for the fluorescent layer.

In addition, the conventional thin film EL element mentioned above has a luminescence efficiency as low as about 0.1%. One reason for the low luminescent efficiency is an insufficiency of excitons. It is considered that excitons take part in luminescence of the luminescent layer 4. It is also considered that luminescence of the conventional EL element is caused by excitons present within or near the impurity for the luminescent center.

DISCLOSURE OF THE INVENTION

The present invention was completed in view of the foregoing. It is an object of the present invention to provide a thin film EL element which glows efficiently owing to a large number of excitons produced in the luminescent layer.

It is another object of the present invention to provide a thin film EL element which emits light of different colors at a low voltage because its luminescent layer can accept a variety of impurities for the luminescent center while remaining electrically neutral, without a need for the addition of a charge compensating element and hence without any likelihood of crystal imperfection.

The first aspect of the present invention is embodied in a thin film EL element of dual dielectric structure having a transparent substrate, and a transparent conducting film, a first dielectric layer, a luminescent layer, and a second dielectric layer, which are formed on top of the other on the substrate, the transparent conducting film and the second dielectric layer being provided with respective electrodes, characterized in that the luminescent layer has a superlattice structure represented by (luminescent host material)/(luminescent host material):(luminescent center impurity).

The second aspect of the present invention is embodied in a thin film EL element as defined in the first embodiment, wherein the luminescent host material has a superlattice structure represented by (II-VI compound)/(III-V compound).

The third aspect of the present invention is embodied in a thin film EL element as defined in the first embodiment, wherein the luminescent center impurity is a trivalent transition metal or a trivalent rare earth metal contained in the III-V compound.

The fourth aspect of the present invention is embodied in a thin film EL element as defined in the first embodiment, wherein the luminescent center impurity is a divalent transition metal or a divalent rare earth metal contained in the II-VI compound and also a trivalent transition metal or a trivalent rare earth metal contained in the III-V compound.

Other and further objects, embodiments, and advantages of the invention will become obvious to one skilled in the art from the following description of preferred embodiments conforming to the principle of the invention, taken in connection with the accompanying drawings.

DETAILED DESCRIPTION OF PREFERRED EMBODIMENTS

The preferred embodiments of the present invention will be explained with reference to FIGS. 6 to 9.

Figure 1:
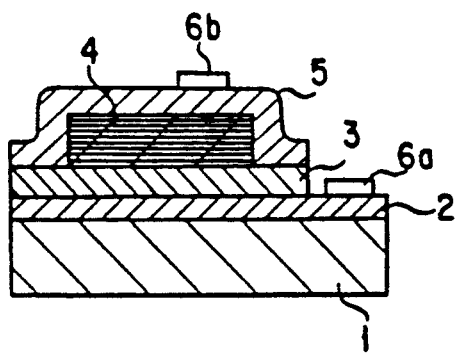
FIG. 1 is a schematic sectional view showing the structure of the conventional thin film EL element.
Figure 2:
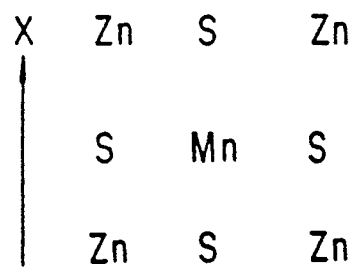
FIGS. 2 to 5 are schematic representations showing the luminescent center impurity in comparative examples.
Figure 3:
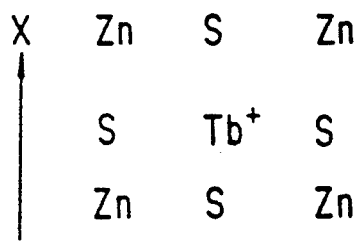
Figure 4:
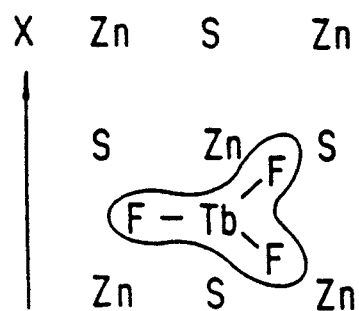
Figure 5:
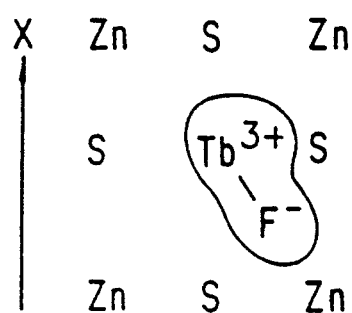
Figure 6:
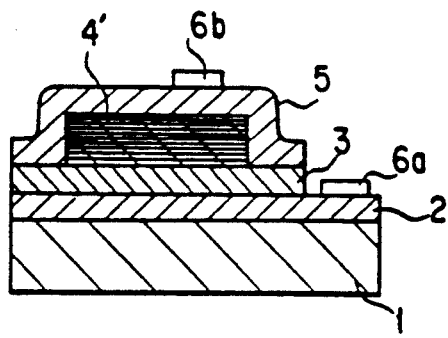
FIG. 6 is a schematic sectional view showing the structure of a thin film EL element pertaining to an embodiment of the present invention.

FIG. 6 is a sectional view showing the structure of a thin film EL element pertaining to the present invention. There is shown a luminescent layer 4', which is made up of a multiplicity of layers (say, 100 to 1000 layers), each composed of a first host material of ZnS, a second host material of $ZnS_{(1-x)}Se_x$, and a luminescent center impurity of Mn. Each layer takes on a superlattice structure represented by $ZnS/ZnS_{(1-x)}Se_x:Mn$ (where $0 < x \leq 1$).

The luminescent layer 4' constructed as mentioned above is prepared by the so-called multiple source deposition (MSD) method, by which the constituting elements are deposited on the substrate by evaporation from individual sources.

The luminescent layer 4' emits light efficiently upon application of a strong electric field across the dielectrics 3 and 5. The light emission results from a large number of excitons which emerge from the interface between ZnS (as the first luminescent host material) and $ZnS_{(1-x)}Se_x$ (as the second luminescent host material). The excitons cause the luminescent center impurity to glow.

In one embodiment of the thin film EL element of dual dielectric structure, the luminescent layer 4' is made of a luminescent host material of the superlattice structure represented by (II-VI compound)/(III-V compound). This thin film EL element is prepared by forming on a transparent substrate 1 a transparent electrode 2 of tin oxide ($SnO_2$), a first dielectric 3 of tantalum pentoxide ($Ta_2O_3$), a luminescent layer 4, of superlattice structure (as mentioned above), and a second dielectric 5 of tantalum pentoxide on top of the other, and providing the electrode 2 and the second dielectric 5 with respective metal terminals 6a, 6b of aluminum (Al).

Figure 7:
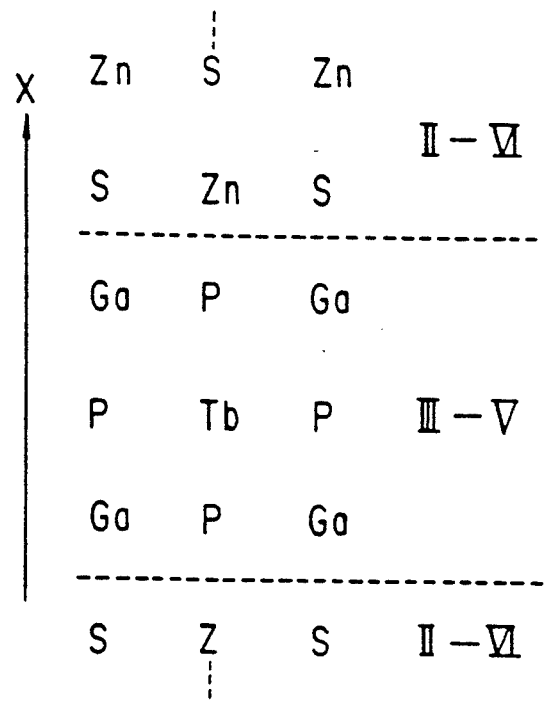
FIG. 7 is a schematic representation showing the luminescent center impurity in an embodiment of the present invention.

The composition of the luminescent layer 4' may vary according to the desired color of light. For example, the luminescent layer 4' will emit green light if the superlattice is composed of zinc sulfide (ZnS) and terbium-doped gallium phosphate (GaP:Tb). The luminescent layer 4' has a band gap in between those of ZnS and GaP, which is adequate for electroluminescence. In addition, the luminescent layer 4' is free of crystal defects because Tb is contained in GaP and hence is capable of light emission at a low voltage. In this embodiment, the superlattice composed of ZnS and GaP:Tb has the luminescent center impurity as shown in FIG. 7. That is, the trivalent impurity exists stably in the crystal of the III-V compound, while the II-VI compound (such as ZnS having a band gap of 3.8 eV) withstands a strong electric field. This leads to the stable high luminance light emission of the EL element.

Figure 8:
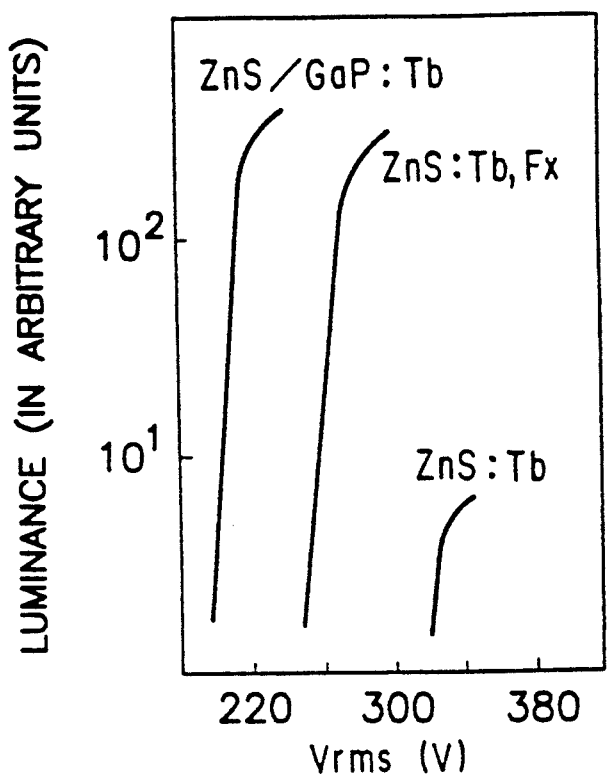
FIG. 8 is a luminance vs. voltage graph to compare the characteristics of an embodiment of the present invention with those of comparative examples.

The foregoing EL element of the present invention in which the luminescent layer is composed of ZnS/GaP:Tb was compared with a comparative EL element in which the luminescent layer is composed of $ZnS:Tb,F_x$ or ZnS:Tb. Their luminance was plotted against voltage as shown in FIG. 8. It is apparent from FIG. 8 that ZnS/GaP:Tb gives rise to a higher luminance at a lower voltage as compared with $ZnS:Tb,F_x$ or ZnS:Tb.

Figure 9:
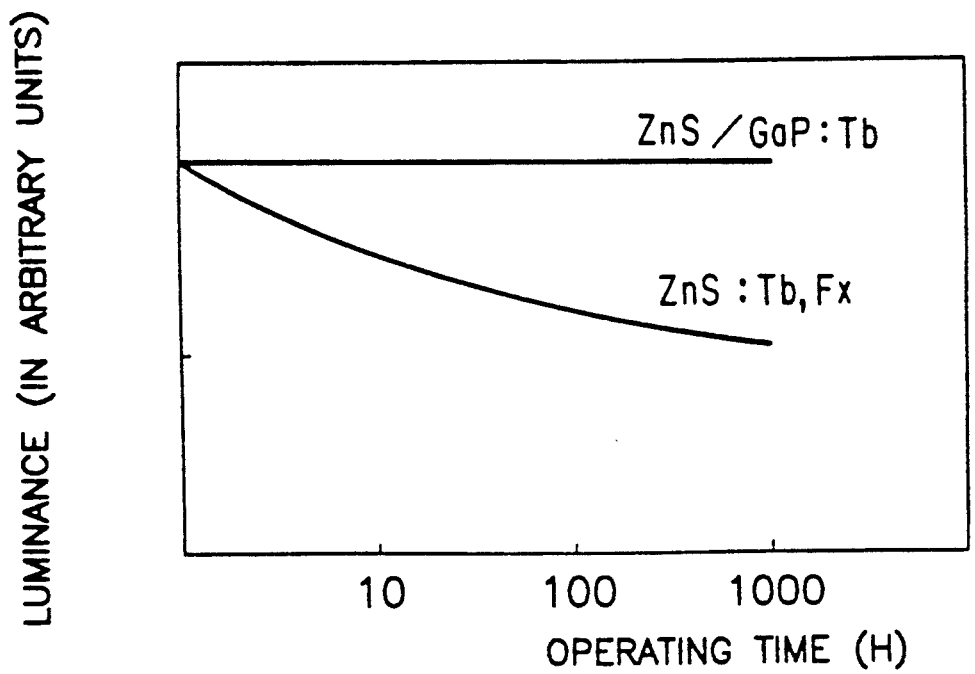
FIG. 9 is a luminance vs. time graph to compare the characteristics of an embodiment of the present invention with those of a comparative example.

The EL element of the present invention was also examined for the change of luminance with time. The result was compared with that of a comparative EL element. ZnS/GaP:Tb is apparently superior to $ZnS:Tb,F_x$ as shown in FIG. 9.

Incidentally, the thin film EL element of the present invention emits white light composed of three primary colors if the superlattice is composed of europium-doped strontium sulfide (SrS:Eu) or cerium- and terbium-doped gallium phosphite (GaP:Ce,Tb).

In the foregoing embodiment of the present invention, the luminescent host material of the luminescent layer 4' takes on the superlattice structure represented by (II-VI compound)/(III-V compound), in which the layer of II-VI compound (20-200Å thick) and the layer of III-V compound (20-200Å thick) are formed alternately until the total layer number reaches 20-500.

What is claimed is:

1. A thin film EL element of dual dielectric structure having a transparent substrate, and a transparent conducting film, a first dielectric layer, a luminescent layer, and a second dielectric layer, which are formed on top of the other on the substrate, the transparent conducting film and the second dielectric layer being provided with respective electrodes, characterized in that the luminescent layer has a superlattice structure represented by (luminescent host material)/(luminescent host material):(luminescent center impurity) wherein the valence number of the luminscent center impurity is equal to a valence number of a cation of the luminscent host material.

2. A thin film EL element as defined in claim 1, wherein the luminescent layer has a superlattice structure represented by (II-VI compound)/(III-V compound).

3. A thin film EL element as defined in claim 2, wherein the luminescent center impurity is a trivalent rare earth metal contained in the III-V compound.

4. A thin film EL element as defined in claim 2, wherein the luminescent center impurity is a divalent transition metal contained in the II-VI compound and also a trivalent rare earth metal contained in the III-V compound.

5. A thin film EL element as defined in claim 2, wherein the luminescent center impurity is a divalent rare earth metal contained in the II-VI compound and also a trivalent transition metal contained in the III-V compound.

6. A thin film EL element as defined in claim 2, wherein the luminescent center impurity is a divalent rare earth metal contained in the II-VI compound and also a trivalent rare earth metal continued in the III-V compound.

7. A thin film EL element as defined in claim 1, wherein the luminescent center impurity is a trivalent transition metal contained in the III-V compound.

8. A thin film EL element as defined in claim 1, wherein the luminescent center impurity is a divalent transition metal contained in the II-VI compound and also a trivalent transition metal contained in the III-V compound.

9. A thin film EL element as defined in claim 1, wherein the luminescent layer has a superlattice structure of (II-VI compound)(III-V compound) and at least one of said II-VI and III-V compounds is doped with a rare earth metal having a valence number equivalent to that of the cation of said at least one compound as an impurity.

10. A thin film EL element as defined in claim 1, wherein the luminescent layer has a superlattice structure of (II-VI compound)(III-V compound) and at least one of said II-VI and III-V compounds is doped with a transition metal having a valence number equivalent to that of the cation of said at least one compound as an impurity.

* * * * *